(12) United States Patent
Yamamoto et al.

(10) Patent No.: US 8,994,864 B2
(45) Date of Patent: Mar. 31, 2015

(54) SOLID-STATE IMAGING DEVICE, AND METHOD FOR DRIVING THE SAME

(71) Applicant: Panasonic Corporation, Osaka (JP)

(72) Inventors: Takahiro Yamamoto, Osaka (JP); Makoto Yarino, Kyoto (JP); Yoshiyuki Matsunaga, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 222 days.

(21) Appl. No.: 13/722,860

(22) Filed: Dec. 20, 2012

(65) Prior Publication Data

US 2013/0107094 A1 May 2, 2013

Related U.S. Application Data

(63) Continuation of application No. PCT/JP2011/003490, filed on Jun. 17, 2011.

(30) Foreign Application Priority Data

Jul. 9, 2010 (JP) ................................. 2010-157290

(51) Int. Cl.
*H04N 3/14* (2006.01)
*H04N 5/335* (2011.01)
(Continued)

(52) U.S. Cl.
CPC ............ *H04N 5/335* (2013.01); *H01L 27/1461* (2013.01); *H01L 27/14692* (2013.01); *H04N 5/363* (2013.01); *H04N 5/378* (2013.01)
USPC ........... 348/302; 348/294; 348/298; 348/308; 348/312

(58) Field of Classification Search
USPC .......................... 348/294, 298, 302, 308, 312; 250/208.1; 257/290–292
See application file for complete search history.

(56) References Cited

U.S. PATENT DOCUMENTS

| 4,363,963 A | 12/1982 | Ando |
| 6,469,740 B1 | 10/2002 | Kuroda et al. |

(Continued)

FOREIGN PATENT DOCUMENTS

| JP | 55-120182 A | 9/1980 |
| JP | 58-050030 B2 | 11/1983 |

(Continued)

OTHER PUBLICATIONS

Japanese Office Action issued in corresponding Japanese Application No. 2010-157290, dated Jan. 14, 2014.

(Continued)

*Primary Examiner* — Twyler Haskins
*Assistant Examiner* — Quang Le
(74) *Attorney, Agent, or Firm* — McDermott Will & Emery LLP

(57) ABSTRACT

A solid-state imaging device according to the present invention includes: a semiconductor substrate; a plurality of pixels disposed on the semiconductor substrate in rows and columns; a column signal line formed for each of the columns; an inverting amplifier connected to the column signal line; and a feedback line, provided for each of the columns, to feed back output signal of the inverting amplifier to pixels in a corresponding column, wherein the amplifying transistor includes a gate connected to the pixel electrode and outputs signal voltage corresponding to the pixel electrode to a column signal line via the selection transistor, and one of a source and a drain of the reset transistor is connected to the pixel electrode and the other is connected to a corresponding feedback line.

14 Claims, 11 Drawing Sheets

(51) Int. Cl.
*H01L 27/146* (2006.01)
*H04N 5/363* (2011.01)
*H04N 5/378* (2011.01)

(56) References Cited

U.S. PATENT DOCUMENTS

| | | |
|---|---|---|
| 6,697,111 B1 | 2/2004 | Kozlowski et al. |
| 6,777,660 B1 | 8/2004 | Lee |
| 7,224,390 B2 | 5/2007 | Kokubun et al. |
| 7,274,397 B2 | 9/2007 | Fowler |
| 8,541,730 B2 | 9/2013 | Inuiya |
| 2003/0146993 A1 | 8/2003 | Kokubun et al. |
| 2003/0151686 A1* | 8/2003 | Koyama ................. 348/304 |
| 2005/0036048 A1 | 2/2005 | Fowler |
| 2009/0091806 A1* | 4/2009 | Inuiya ..................... 358/482 |
| 2010/0020217 A1* | 1/2010 | Abe et al. ............... 348/308 |

FOREIGN PATENT DOCUMENTS

| | | |
|---|---|---|
| JP | 10-281870 A | 10/1998 |
| JP | 2003-234959 A | 8/2003 |
| JP | 2005-065270 A | 3/2005 |
| JP | 2009-094273 A | 4/2009 |

OTHER PUBLICATIONS

International Search Report mailed Aug. 30, 2011 issued in corresponding International Application No. PCT/JP2011/003490.

\* cited by examiner

SOLID-STATE IMAGING DEVICE, AND METHOD FOR DRIVING THE SAME

CROSS REFERENCE TO RELATED APPLICATIONS

This is a continuation application of PCT International Application No. PCT/JP2011/003490 filed on Jun. 17, 2011, designating the United States of America, which is based on and claims priority of Japanese Patent Application No. 2010-157290 filed on Jul. 9, 2010. The entire disclosures of the above-identified applications, including the specifications, drawings and claims are incorporated herein by reference in their entirety.

FIELD

The present invention relates to solid-state imaging devices, and in particular, to a stack-type solid-state imaging device and a method for driving the same.

BACKGROUND

General solid-state imaging devices use a buried photodiode structure as a light reception unit. Meanwhile, a solid-state imaging device having a structure which does not use a buried photodiode (stack-type solid-state imaging device) is also known (for example, refer to Patent Literature 1).

Patent Literature 1, for example, discloses a stack-type solid-state imaging device in which a photoelectric conversion layer is formed on a control electrode comprising a solid-state amplifying device and a transparent electrode layer is provided on the formed photoelectric conversion layer. The stack-type solid-state imaging device can convert, into an electrical signal, optical information at a good S/N ratio by exercising, to the control electrode, the operation of voltage applied to the transparent electrode layer via the photoelectric conversion layer.

In this way, the stack-type solid-state imaging device has a configuration in which a photoelectric conversion film is formed, via an insulating film, above a semiconductor substrate on which a pixel circuit is formed. Therefore, it is possible for a material having a large light absorption coefficient, such as amorphous silicon and the like, to be used in a photoelectric conversion film. For example, the amorphous silicon can mostly absorb green light having a wavelength of 550 nm at a thickness of about 0.4 nm.

Moreover, since the stack-type solid-state imaging device has a configuration without using a buried photodiode, the stack-type solid-state imaging device can increase capacity of a photoelectric conversion unit and magnify saturated charge. Furthermore, the stack-type solid-state imaging device can actively add capacity since charge is not completely transferred, and can realize a sufficient capacity even in a miniaturized pixel. Moreover, it is possible to form with a structure such as stack cell in a dynamic random access memory.

CITATION LIST

Patent Literature

Japanese Unexamined Patent Application Publication No. 55-120182

SUMMARY

Technical Problem

However, the solid-state imaging device disclosed in Patent Literature 1 has a problem that it has larger random noise than the general buried photodiode-type solid-state imaging device. The following will describe the matter.

The general buried photodiode-type solid-state imaging device can almost completely transfer charge. In other words, it is possible for a fixed-pattern noise to be canceled when a sampling of (signal level+fixed patter noise)−(black level+fixed pattern noise)=signal level is performed in a Correlated Double Sampling (CDS) circuit. Therefore, the buried photodiode-type solid-state imaging device uses a method for suppressing, to $1/\sqrt{2}$, noise by combining strong inversion operation of a reset transistor with weak inversion operation of a reset transistor when resetting a signal. In contrast, the stack-type solid-state imaging device cannot use the above mentioned method.

Since the stack-type solid-state imaging device cannot completely transfer charge, reset noise cancellation is imperfect even when the sampling is performed by the buried photodiode-type solid-state imaging device in the CDS circuit. In other words, since the next signal charge is added when noise is generated, signal charge on which reset noise is superimposed is read and random noise is larger. It should be noted that the trailing edge (rear edge) of reset pulse is a falling edge when the reset pulse included in the reset signal is a positive pulse (upward pulse). The trailing edge of reset pulse (rear edge) is a rising edge when the reset pulse is a negative pulse (downward pulse).

Moreover, in the solid-state imaging device disclosed in Patent Literature 1, when signal charge is reset, noise is generated. In other words, random noise is generated by capacitive coupling between a reset signal line and a pixel electrode due to the trailing edge (rear edge) of the reset pulse included in the reset signal.

Furthermore, in recent years, there is a video standard requiring a frame rate of 60 per second as shown in High Definition (HD), and there is growing request for a high frame rate for video. Therefore, a method in which time is spent to suppress the above described random noise and the frame rate is slower cannot be used.

The present invention pays attention to the above described problem, and has an object to provide a solid-state imaging device for suppressing random noise and a method for driving the solid-state imaging device.

Solution to Problem

A solid-state imaging device according to an aspect of the present invention for solving the above described problem includes: a semiconductor substrate; a plurality of pixels disposed on the semiconductor substrate in rows and columns; a column signal line formed for each of the columns; an inverting amplifier connected to each of the column signal lines; and a feedback line provided, for each of the columns, to feed back an output signal of the inverting amplifier to the pixels in the column, wherein each of the pixels includes a reset transistor, a selection transistor, an amplifying transistor, and a photoelectric conversion unit, the photoelectric conversion unit includes: a photoelectric conversion film which performs photoelectric conversion; a pixel electrode formed on a surface of the photoelectric conversion film on a side of the semiconductor substrate; and a transparent electrode formed on a surface of the photoelectric conversion film on an opposite side of the pixel electrode, wherein the amplifying transistor has a gate connected to the pixel electrode and outputs signal voltage corresponding to potential of the pixel electrode to the column signal line via the selection transistor, and the reset transistor has one of a source and a drain connected to the pixel electrode and the other of the source and the drain connected to a corresponding feedback line.

With this configuration, by feeding back the output of the inverting amplifier, since the reset noise can be suppressed which is generated when signal charge of the pixel electrode is reset by a reset transistor and this can reduce the superimposition of the reset noise on the next signal charge, random noise can be suppressed. Noise can be reduced which is generated by variations in circuits by feedback (for example, Vth unevenness in amplifying transistors for each of the columns).

Here, a row selection signal may be applied to a gate of the selection transistor, a row reset signal may be applied to a gate of the reset transistor, and the row reset signal may be validated after a certain period of time following validation of the row selection signal, and is valid for a period within a period of time in which the row selection signal is valid.

With this configuration, a feedback loop can be easily formed.

Here, the solid-state imaging device may further include a waveform adjusting unit configured to adjust a waveform of the row reset signal to be applied to the gate of the reset transistor, wherein the waveform adjusting unit is configured to adjust the waveform of a reset pulse of the reset signal to have a slope at a trailing edge, and to provide the gate of the reset transistor with the reset signal including the adjusted reset pulse.

With this configuration, random noise can be reduced which is generated by the trailing edge of the pulse included in the reset signal.

Here, the solid-state imaging device may be capable of switching between imaging at a first frame rate and imaging at a second frame rate that is higher than the first frame rate, and the waveform adjusting unit may be configured to adjust the reset pulse to have a slope of the trailing edge so that transition time for the imaging at the first frame rate is longer than transition time for the imaging at the second frame rate, the transition time being required for the trailing edge of the reset pulse to fall or rise.

With this configuration, it is possible for the stack-type solid-state imaging device capable of capturing an image at a frame rate corresponding to a scene, to reduce noise corresponding to various frame rates.

Here, the waveform adjusting unit may be a filter circuit which is inserted into a reset control line connected to the gate of the reset transistor.

The waveform adjusting unit may be configured to adjust the slope of the trailing edge of the reset pulse by changing a circuit constant of the filter circuit.

The waveform adjusting unit may include a digital-to-analog converter which outputs, as the row reset signal, an analog signal having a slope at the trailing edge of the reset pulse.

With this configuration, the accuracy of adjusting the slope of the trailing edge of the pulse included in the reset signal can be improved.

Here, the solid-state imaging device may further include a waveform adjusting unit configured to adjust a waveform of the row reset signal to be applied to the gate of the reset transistor, wherein the waveform adjusting unit may be configured to adjust a frequency band of a trailing edge of the reset pulse included in the row reset signal.

Here, the waveform adjusting unit may be further configured to receive a row reset signal before waveform adjustment having an amplitude corresponding to a power source voltage, and to adjust the waveform to reduce the amplitude of the row reset signal.

With this configuration, random noise can be reduced which is generated by the trailing edge of the pulse included in the reset signal, and it is easier for a frame rate to be higher.

Here, it is desirable that the amplitude of the row reset signal to be applied to the gate of the reset transistor is smaller than a maximum voltage to be applied to the drain of the amplifying transistor.

Here, it is desirable that the amplitude of the row reset signal to be applied to the gate of the reset transistor is smaller than a maximum voltage to be applied to the gate of the selection transistor.

Here, it is desirable that the amplitude of the row reset signal to be applied to the gate of the reset transistor is smaller than a power source voltage to be applied to the inverting amplifier.

Here, it is desirable that the amplitude of the row reset signal to be applied to the gate of the reset transistor is smaller than a maximum voltage to be applied to the transparent electrode.

Here, the amplitude of the row reset signal to be applied to the gate of the reset transistor may be smaller than: (a) a maximum voltage to be applied to the drain of the amplifying transistor; (b) a maximum voltage to be applied to the gate of the selection transistor; (c) a power source voltage to be applied to the inverting amplifier; and (d) a maximum voltage to be applied to the transparent electrode.

Moreover, a solid-state imaging device according to another aspect of the present invention includes: a plurality of pixels disposed on a semiconductor substrate in rows and columns; a row scanning unit configured to generate a row reset signal; and a waveform adjusting unit configured to adjust a waveform of the row reset signal to be applied to a gate of the reset transistor, wherein each of the pixels includes a reset transistor, a selection transistor, an amplifying transistor, and a photoelectric conversion unit, the photoelectric conversion unit includes: a photoelectric conversion film which performs photoelectric conversion; a pixel electrode formed on a surface of the photoelectric conversion film on a side of the semiconductor substrate; and a transparent electrode formed on a surface of the photoelectric conversion film on an opposite side of the pixel electrode, wherein the amplifying transistor has a gate connected to the pixel electrode and outputs signal voltage corresponding to potential of the pixel electrode to a column signal line via the selection transistor, and the waveform adjusting unit is configured to adjust the waveform of a reset pulse of the reset signal to have a slope at a trailing edge, and to provide the adjusted row reset signal to the gate of the reset transistor.

A method for driving a solid-state imaging device according to an aspect of the present invention, wherein the solid-state imaging device includes: a semiconductor substrate; a plurality of pixels disposed on the semiconductor substrate in rows and columns; a column signal line formed for each of the columns; an inverting amplifier connected to each of the column signal lines; and a feedback line provided, for each of the columns, to feed back an output signal of the inverting amplifier to the pixels in the column, wherein each of the pixels includes a reset transistor, a selection transistor, an amplifying transistor, and a photoelectric conversion unit, the photoelectric conversion unit includes: a photoelectric conversion film which performs photoelectric conversion; a pixel electrode formed on a surface of the photoelectric conversion film on a side of the semiconductor substrate; and a transparent electrode formed on a surface of the photoelectric conversion film on an opposite side of the pixel electrode, wherein the amplifying transistor has a gate connected to the pixel electrode and outputs signal voltage corresponding to potential of the pixel electrode to the column signal line via the selection transistor, and the reset transistor has one of a source and a drain connected to the pixel electrode and the other of the source and the drain connected to a corresponding feedback line, the method for driving the solid-state imaging device comprising: outputting an output signal of the amplifying transistor to a column signal line by validating a row selection signal in a gate of the selection transistor; and feeding back an output of the inverting amplifier via the reset transistor to the pixel electrode by validating the row reset signal after a certain period of time following validation of the row selection signal.

Advantageous Effects

The solid-state imaging device according to the present invention can reduce random noise. Moreover, it is possible for the solid-state imaging device to reduce random noise corresponding to a frame rate according to a scene.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Embodiment 1

Figure 1:
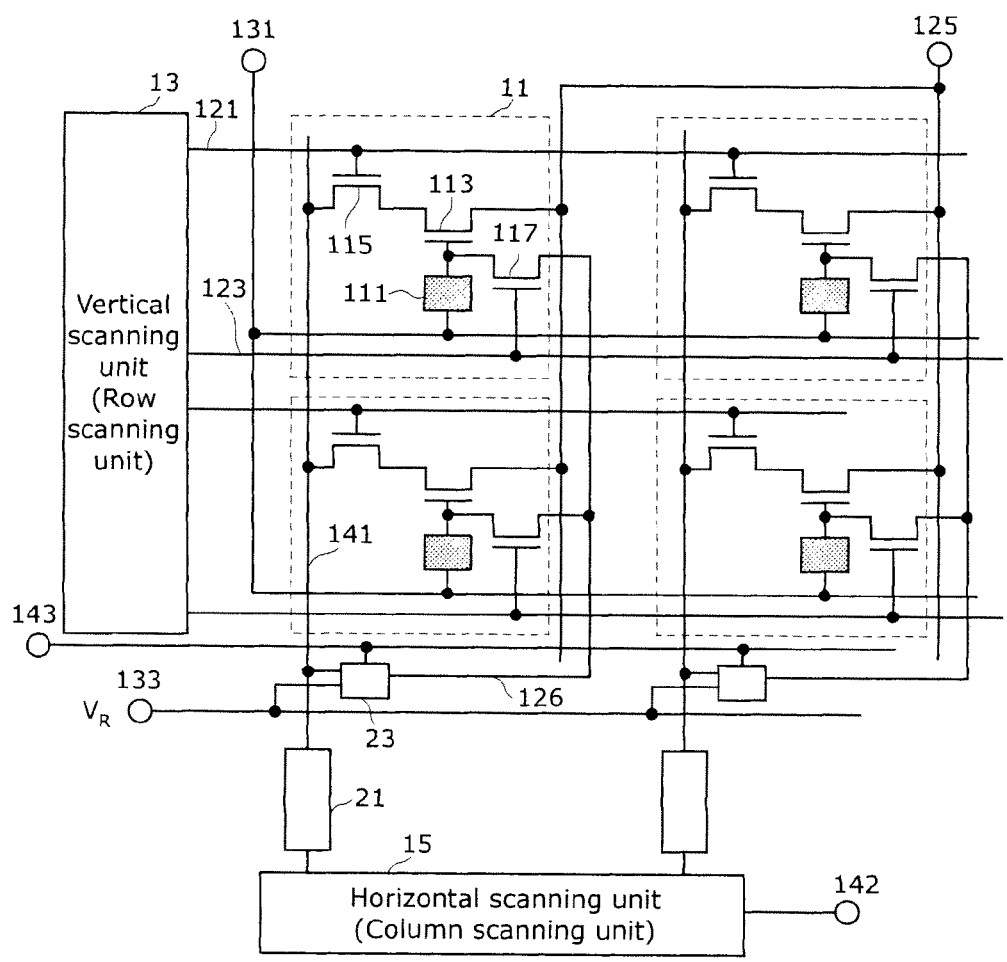
FIG. 1 is a circuit diagram showing a solid-state imaging device according to Embodiment 1.
Figure 2:
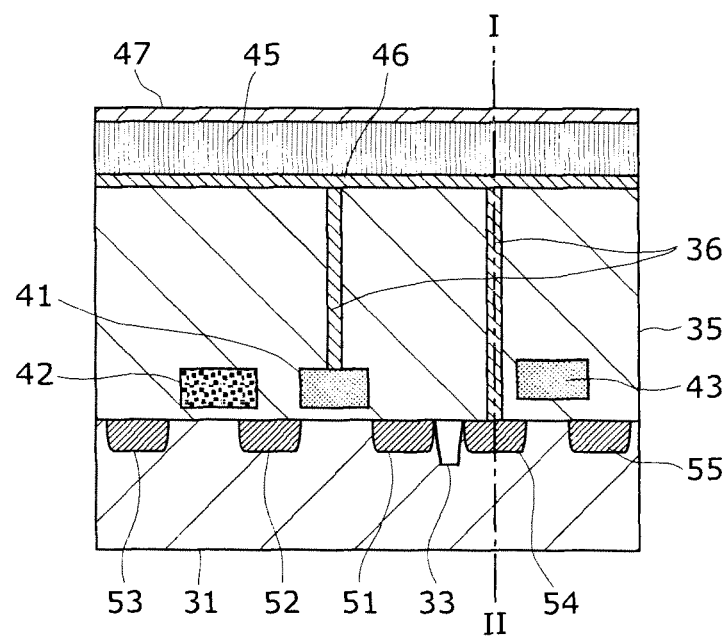
FIG. 2 is a cross sectional view of a pixel in a solid-state imaging device according to Embodiment 1.

FIG. 1 is a schematic view of a solid-state imaging device according to the present embodiment. FIG. 2 is a structural cross sectional view of a pixel 11 of FIG. 1.

As shown in FIG. 1, the solid-state imaging device includes: a plurality of pixels 11 disposed on a semiconductor substrate 31 (not illustrated) in rows and columns; a vertical scanning unit 13 (also called row scanning unit) which supplies various timing signals to the pixels 11; a horizontal scanning unit 15 (also called column scanning unit or horizontal signal reading unit) which sequentially reads the signals of the pixel 11 to a horizontal output terminal 142; a column signal line 141 which is formed for each of the columns; an inverting amplifier 23 connected to the column signal line; a feedback line 126 which is provided for each of the columns for feeding back the output signal of the inverting amplifier 23 to pixels 11 of a corresponding column. It should be noted that in FIG. 1, the pixels are illustrated only in two rows by two columns. However, the number of columns and the number of rows may be arbitrarily set. FIG. 2 shows an amplifying transistor 113, a selection transistor 115, and a reset transistor 117 that are formed in a semiconductor substrate 31 including silicon.

Moreover, each of the pixels 11 has a photoelectric conversion unit 111, the amplifying transistor 113 having a gate that is connected to the photoelectric conversion unit 111, a reset transistor 117 having a drain that is connected to the photoelectric conversion unit 111, and a selection transistor 115 which is connected in series to the amplifying transistor 113.

Moreover, as shown in FIG. 2, an insulating film 35 is formed on the semiconductor substrate 31 for covering each of the transistors. Above the insulating film 35, the photoelectric conversion unit 111 is formed. The photoelectric conversion unit 111 includes a photoelectric conversion film 45 comprising amorphous silicon and the like, a pixel electrode 46 formed on the bottom surface of the photoelectric conversion film 45, and a transparent electrode 47 formed on the top surface of the photoelectric conversion film 45. In other words, the photoelectric conversion unit 111, as shown in FIG. 2, includes the photoelectric conversion film 45 which performs photoelectric conversion, the pixel electrode 46 which is formed on the surface of the photoelectric conversion film on the side of the semiconductor substrate, and the transparent electrode 47 which is formed on the surface of the photoelectric conversion film on the opposite side of the pixel electrode. The photoelectric conversion unit 111 is connected between a gate of the amplifying transistor 113 and a drain of the reset transistor 117, and the photoelectric conversion unit control line 131.

As shown in FIG. 2, the amplifying transistor 113 includes a gate electrode 41, a diffusion layer 51 that is a drain, and a diffusion layer 52 that is a source. Moreover, the amplifying transistor 113 includes a gate connected to the pixel electrode 46 (gate electrode 41) and outputs the signal voltage corresponding to the potential of the pixel electrode 46 to the column signal line 141 via the selection transistor 115.

One of the source and the drain for the reset transistor 117 is connected to the pixel electrode 46, and the other one of the source and the drain is connected to the corresponding feedback line 126. The gate of the reset transistor 117 is connected to the vertical scanning unit 13 via the reset control line 123. As shown in FIG. 2, the reset transistor 117 includes the gate electrode 43, a diffusion layer 54 that is a drain, and a diffusion layer 55 that is a source.

As shown in FIG. 2, the selection transistor 115 includes a gate electrode 42, the diffusion layer 52 that is the drain, and a diffusion layer 53 that is a source. It should be noted that the source of the amplifying transistor and the drain of the selection transistor is the common diffusion layer 52. Diffusion layers 51 and 54 are isolated by an element isolation region 33.

The gate of the selection transistor 115 (gate electrode 42) is connected to the vertical scanning unit 13 via an address control line 121. The address control line 121 and the reset control line 123 are provided for each of the columns.

The pixel electrode 46 is connected, via a contact 36, to the gate electrode 41 of the amplifying transistor 113 and the diffusion layer 54 that is the source of the reset transistor 117. The diffusion layer 54 connected to the pixel electrode 46 functions as a storage diode.

The following (present embodiment) will describe the case where the reset transistor 117 is an n-type MOS transistor, the reset pulse included in the reset signal inputted to the gate is a positive pulse (upward pulse), and the trailing edge of the reset pulse is a falling edge.

The photoelectric conversion unit control line 131 is common to all pixels. The column signal line 141 is provided for each of the columns, and is connected to the horizontal signal reading unit (horizontal scanning unit 15) via the column signal processing unit 21. The column signal processing unit 21 performs noise suppression signal processing represented by correlated double sampling, and analog-to-digital conversion, or the like.

The inverting amplifier 23 is connected to each column signal line 141 provided for a corresponding one of the columns. When standard voltage ($V_R$) 133 that is common to all pixels is also inputted to the inverting amplifier 23, the output of the inverting amplifier 23 is connected to the source of the reset transistor 117, and the selection transistor 115 and the reset transistor 117 are in conduction state, the inverting amplifier 23 receives the output of the selection transistor 115 and performs feedback operation such that the gate potential of the amplifying transistor 113 is constant. At this time, the output of the inverting amplifier 23 is positive voltage of 0V or near 0V.

Figure 3:
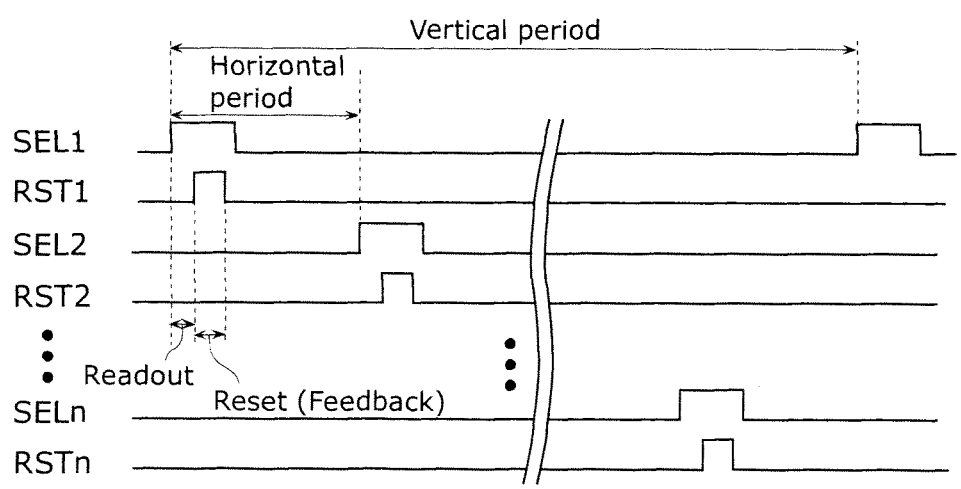
FIG. 3 is a time chart showing an operation of a solid-state imaging device according to Embodiment 1.

FIG. 3 is a flowchart for the most basic operation of the solid-state imaging device. SEL1 in FIG. 3 shows a row selection signal in the first row. RST1 shows a row selection signal in the first row. SEL2 and RST2 are also the same with the only difference in the corresponding rows. One horizontal period is a period of time from when the row selection signal is validated to when the row selection signal in the next row is validated (from the rising of SEL1 to the rising of SEL2), and a period necessary to read signal voltage from pixels in one column. One vertical period is a period of time necessary to read signal voltage from pixels in all rows.

The feedback operation occurs when the row selection signal and the row reset signal are validated at the same time. In other words, it occurs when the selection transistor and the reset transistor are turned on at the same time. As shown in FIG. 3, the vertical scanning unit 13 controls such that reset (feedback operation) is performed after signal readout from pixels. First, by validating the row selection signal at the gate of the selection transistor 115, the output signal of the amplifying transistor is outputted to the column signal line, and second, by validating the row reset signal after a certain period of time following validation of the row selection signal, the output of the inverting amplifier is fed back to the pixel electrode via the reset transistor.

With the feedback operation, since the reset noise generated when signal voltage is reset by the reset transistor 117 is suppressed and this can reduce the superimposition of the reset noise on the next signal charge, random noise can be suppressed.

As described above, since the solid-state imaging device according to the present embodiment uses the photoelectric conversion unit having a large light absorption coefficient, quantization efficiency is significantly high. Therefore, the effect when the random noise is reduced is significantly great.

Moreover, since the solid-state imaging device according to the present embodiment can reduce an area of the photodiode and increase conversion gain on a circuit, the effect when the random noise is reduced is significantly great. Furthermore, since, structurally, the present invention does not perform photoelectric conversion in the semiconductor substrate, the effect when the random noise is suppressed is significantly great.

Furthermore, by performing a feedback operation using the inverting amplifier on each of the column signal lines, reset noise in the stack-type solid-state imaging device can be suppressed. This can also reduce the superimposition of the reset noise on the next signal charge. Therefore, random noise can be suppressed.

Embodiment 2

The following will describe a solid-state imaging device according to Embodiment 2 of the present invention. The difference from the solid-state imaging device according to Embodiment 1 will be mainly described.

First, in Embodiment 1, reset noise in the photoconductive film laminated sensor can be suppressed, and a means for suppressing reset noise is further included.

Figure 4:
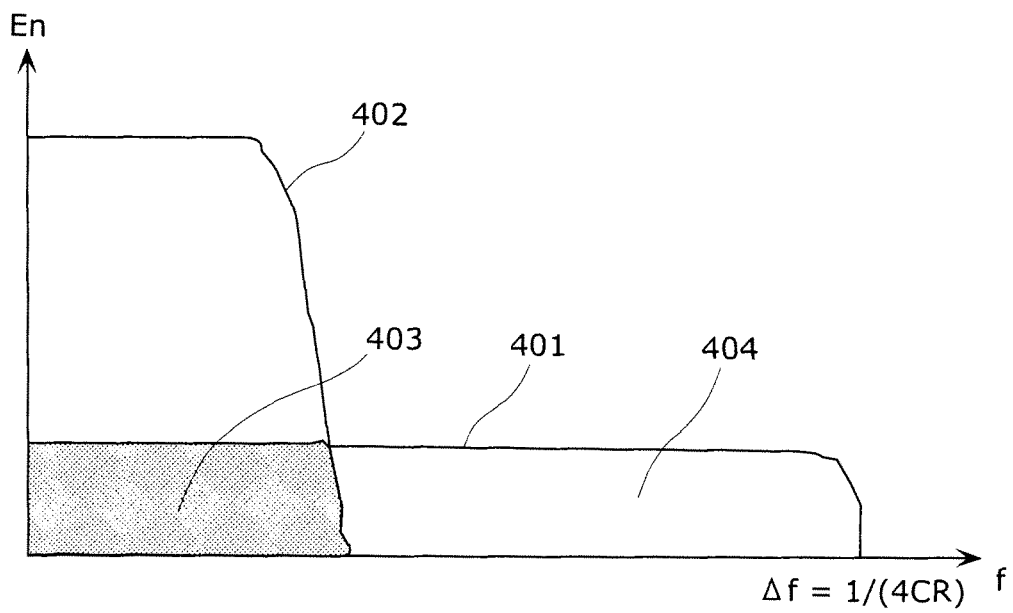
FIG. 4 is a graph showing reset noise with respect to reset frequency in Embodiment 2.

More specifically, the reset noise according to Embodiment 1 is called kTC noise, and the voltage (En) is expressed by the following expression (1).

$$En^2 = kT/C$$

$$En = \sqrt{(kT/C)} = \sqrt{(4kTR\Delta f)} \qquad (1)$$

k denotes Boltzmann constant, T denotes absolute temperature (K), R denotes resistance value (Ω) of the reset transistor 117, C denotes parasitic capacitance (F) of the reset transistor 117, and Δf denotes reset frequency (Hz) of the reset transistor 117. From the expression (1), it is found that the voltage (En) of reset noise generated in the reset transistor 117 is limited by the bandwidth (Δf) of reset frequency of the reset transistor 117, assuming that 4kTR is a constant (in other words, when Δf is small, En is also small). Here, the reset frequency is mainly a frequency component included in the trailing edge of the pulse included in the row reset signal. FIG. 4 is a diagram showing reset noise En with respect to reset frequency f.

401 is reset noise voltage (En) when the reset frequency of the reset transistor 117 is shown in a horizontal axis, 402 is feedback frequency band of the inverting amplifier 23 according to Embodiment 1, and a region in which 401 and 402 are crossed (reset noise suppressible region 403) is a suppressible reset noise according to Embodiment 1, and 404 is reset noise which cannot be suppressed in Embodiment 1.

Here, the bandwidth (Δf) of the reset frequency of the reset transistor 117 can be expressed by the following expression based on the expression (1).

$$\Delta f = 1/(4CR) \qquad (2)$$

The bandwidth (Δf) of the reset frequency of the reset transistor 117 can be expressed in time constant 1/CR by the expression (2). When the parasitic capacitance C of the reset transistor 117 is neglected because it can be reduced in Embodiment 1, the bandwidth (Δf) of the reset frequency of the reset transistor 117 is limited by the resistance value R of the reset transistor 117.

In other words, when the resistance value R is greater, Δf is smaller. This represents that the frequency f is slow (low frequency). The resistance value R of the reset transistor 117 represents difficulty of conduction for the reset transistor 117. This can be replaced with the bandwidth of the reset signal to be applied to the gate of the reset transistor 117 (when the resistance R is greater, time for reset is longer).

Figure 5:
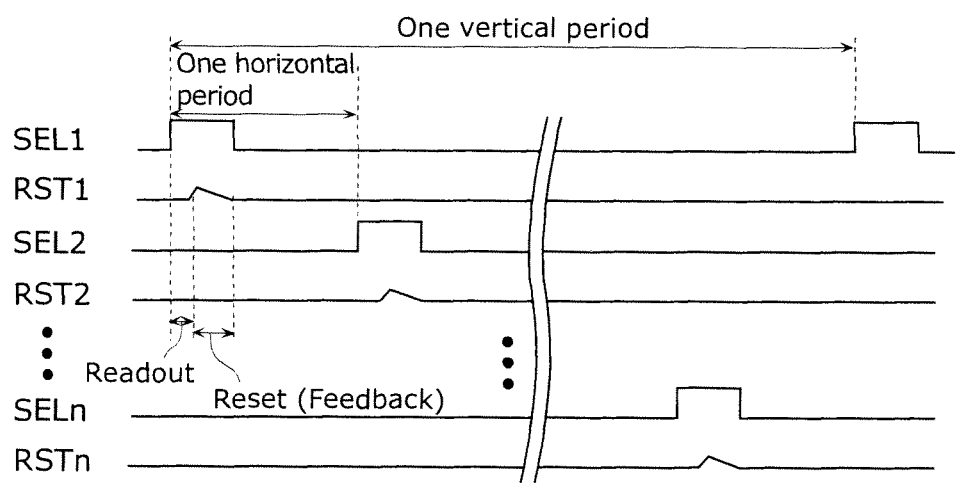
FIG. 5 is a time chart showing an operation of a solid-state imaging device according to Embodiment 2.

FIG. 5 is a flowchart showing the basic imaging operation of the solid-state imaging device according to the present embodiment. FIG. 5 is different from FIG. 3 in that a slope is provided to the falling edge of the reset pulse of the row reset signal. It should be noted that in FIG. 3, a slope is also provided to the rising edge of the reset pulse. Moreover, FIGS. 3 and 5 share the fact that the amplitude of the reset pulse having a sloped edge is small.

In this way, a slope is provided to the falling edge of the row reset signal. In other words, the band of the frequency component included in the falling edge in FIG. 5 is narrower compared with a steep falling edge. With this, the generation of random noise caused by the falling edge can be reduced. Moreover, since the amplitude of the row reset signal is small and a slope is provided to the edge, the reset transistor does not operates as a simple switch having two states of on and off but operates as a switch in which the resistance value continuously changes from on to off.

Figure 6:
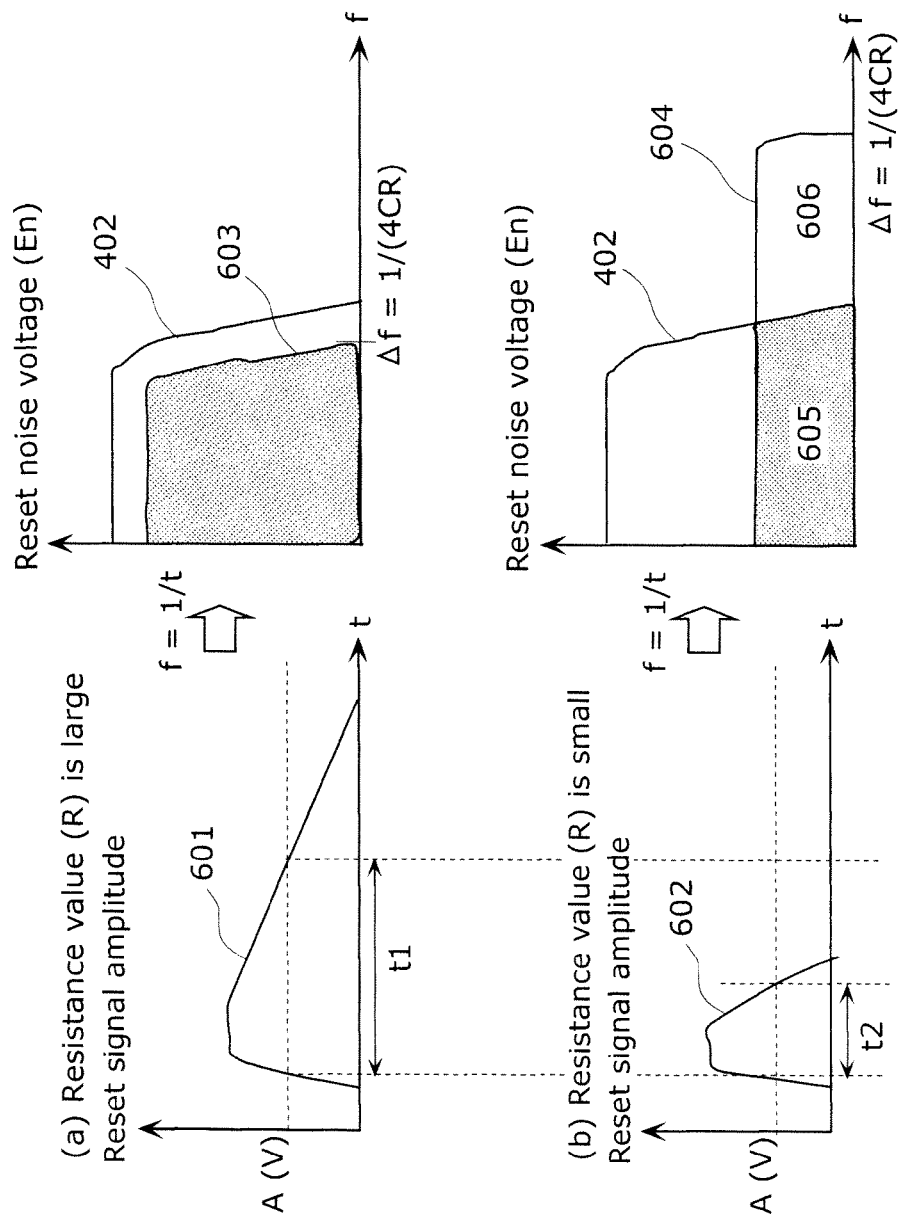
FIG. 6 is a graph showing a relationship between reset band by resistance of reset transistor and reset noise in Embodiment 2.

FIG. 6 shows a relationship between the band of the resistance value R of the reset transistor 117 and the reset noise En. When (a) the horizontal axis is time t and the resistance R of the reset transistor 117 is large, the reset signal on the gate of the reset transistor 117 is like being dull as shown in 601, a high time period of the reset signal (A volts) can be indicated as t1. In contrast, when (b) the resistance value R of the reset transistor 117 is small, the reset signal to be applied to the gate of the reset transistor 117 is steep as shown in 602, a high time period of the reset signal (A volts) can be indicated as t2.

When the horizontal axis is frequency f as similarly to FIG. 4 and (a) the resistance value R of the reset transistor 117 is large, reset noise (En), as shown in 603, is more likely to enter the feedback frequency band (402) of the inverting amplifier 23. Therefore, reset noise is easy to be suppressed by the feedback circuit according to Embodiment 1. When (b) the resistance R of the reset transistor 117 is small, reset noise (En), as shown in 604, is likely to generate a band which does not enter the feedback frequency band (402) of the inverting amplifier 23. Therefore, reset noise is difficult to be suppressed. It should be noted that 605 is a region in which reset noise (En) is suppressed, and the area of 603 is equal to the area of 604.

In other words, it is found that when the reset band of the reset signal inputted to the gate of the reset transistor 117 is longer than t2, as similarly to t1, it is found that the reset noise generated in the reset transistor 117 can be suppressed.

Figure 7:
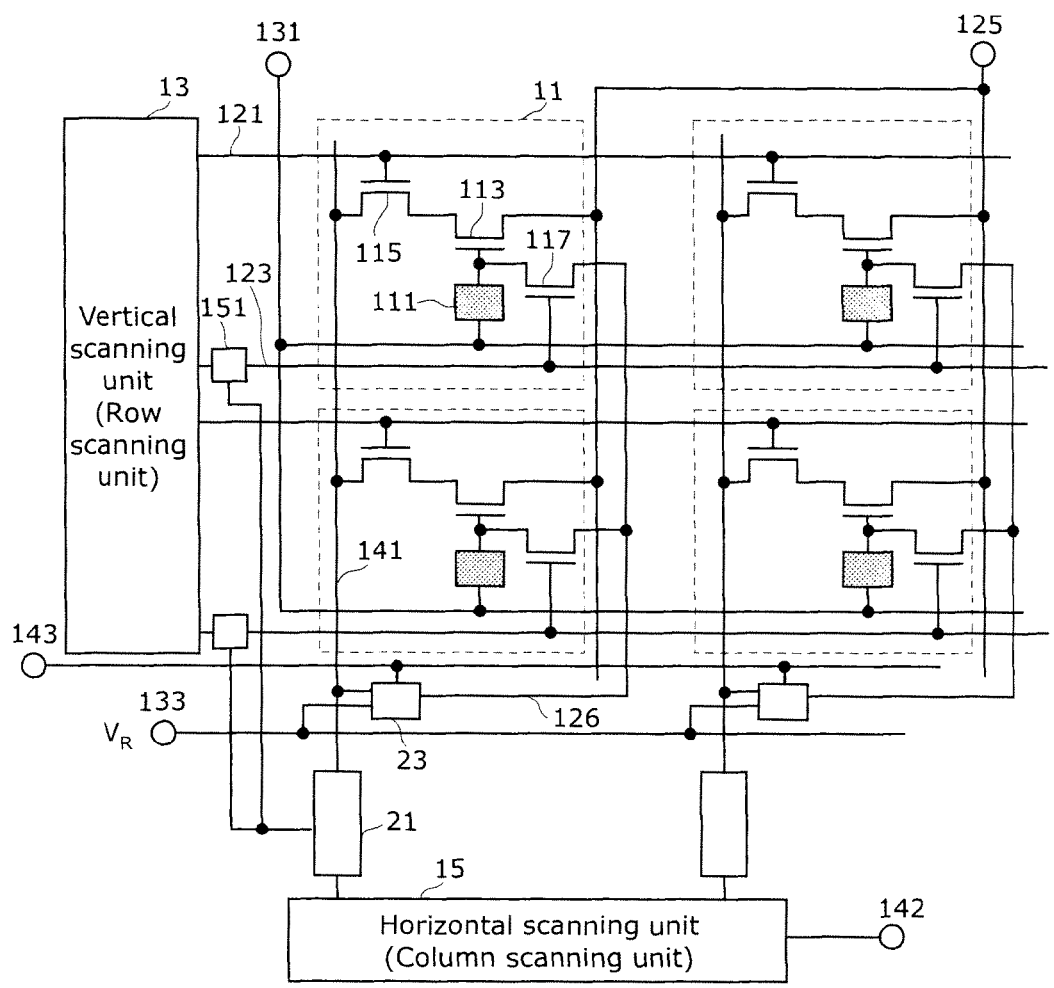
FIG. 7 is a circuit diagram showing a solid-state imaging device according to Embodiment 2.

Next, FIG. 7 is an overall block diagram of the solid-state imaging device according to Embodiment 2 of the present invention. More specifically, the main difference from the configuration diagram in Embodiment 1 (FIG. 1) is that a reset signal control element 151 is added. Description of the same points will be omitted, and the following different points will be mainly described.

The reset signal control element 151 is a waveform adjusting unit which adjusts the waveform of the row reset signal to be applied to the gate of the reset transistor 117. The reset signal control element (waveform adjusting unit) 151 adjusts the waveform of a reset pulse of the reset signal to have a slope at a trailing edge, and provides the row reset signal including the adjusted reset pulse to the gate of the reset transistor 117.

In other words, the reset signal control element (waveform adjusting unit) 151 adjusts the frequency band of the falling edge of the row reset signal.

Moreover, an example of a circuit of the reset signal control element 151 shown in FIG. 7 is shown in FIGS. 8A to 8E.

Figure 8A:
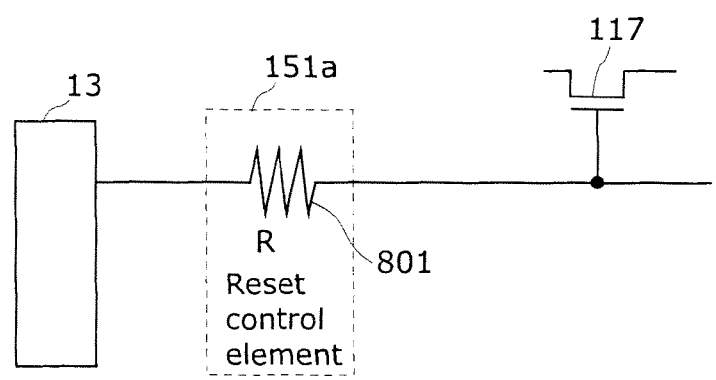
FIG. 8A is a diagram showing an example of a circuit of a reset signal control element.
Figure 8B:
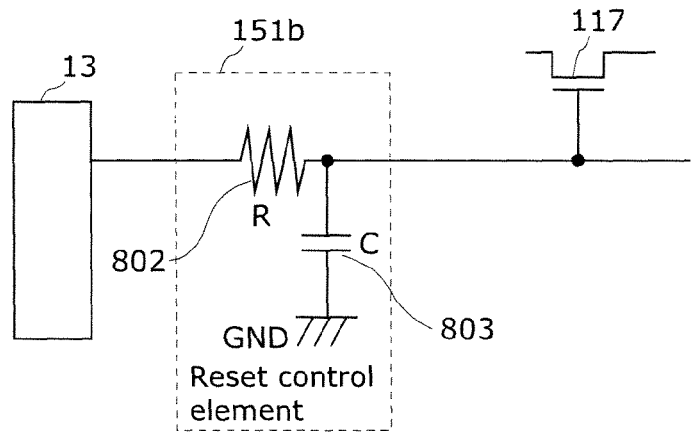
FIG. 8B is a diagram showing an example of a circuit of a reset signal control element.

The reset signal control element 151 may be a resistive element R (801) such as a reset signal control element 151a as shown in FIG. 8A, a filter circuit (RC filter circuits, that is, 802 and 803) such as a reset signal control element 151b as shown in FIG. 8B, and a general tapered circuit. In other words, the reset signal control element 151 is acceptable as long as the reset signal inputted to the gate of the reset transistor 117 can adjusted and the reset band of the reset signal can be adjusted.

In other words, the reset signal control element 151 performs wave adjustment and adjust reset band for the reset signal outputted from the vertical scanning unit 13.

Figure 8C:
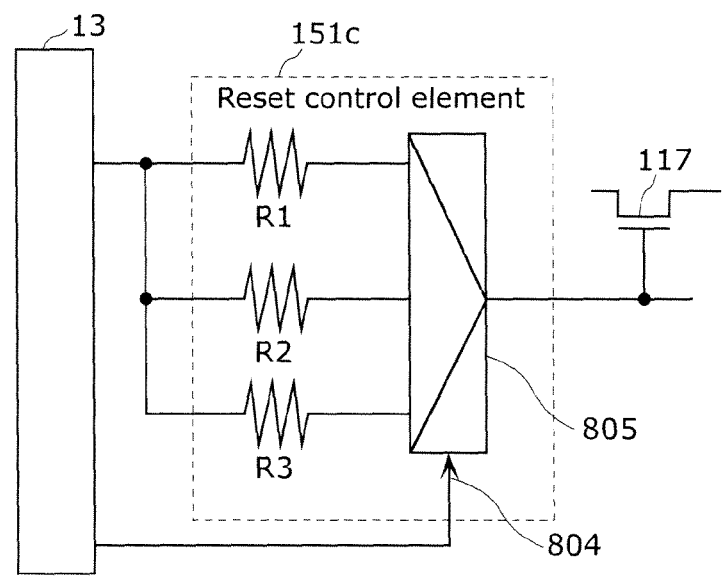
FIG. 8C is a diagram showing an example of a circuit of a reset signal control element.
Figure 8D:
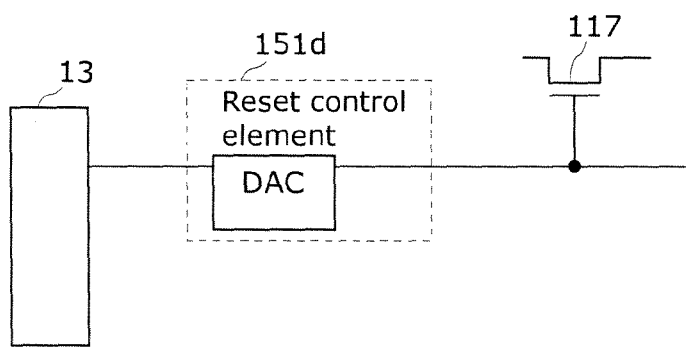
FIG. 8D is a diagram showing an example of a circuit of a reset signal control element.
Figure 8E:
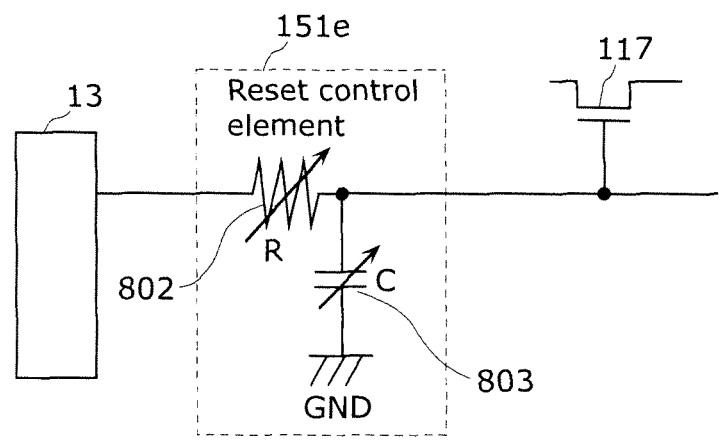
FIG. 8E is a diagram showing an example of a circuit of a reset signal control element.

In FIG. 8C, a reset signal control element 151c when resistance value can be selected using a plurality of resistive elements is illustrated. A relationship between the resistance values of the resistances within the reset signal control element 151c is R3>R2>R1. The reset signal in which the reset band is adjusted after passing the resistance value of the resistance selected from the resistances having the resistance values R1 to R3 by a selector 805 with a resistance value selection signal 804 is inputted to the gate of the reset transistor 117.

In an example of FIG. 8C, since the resistance value is larger in R3 than in R1, the reset signal becomes dull and time for reset is longer. Depending on the imaging scene, the reset band can be adjusted. In FIG. 8C, the case is described where the resistance value is selected from three. However, the number of resistance values that can be selected is not limited.

Moreover, in FIG. 8B, the RC filter circuits (802 and 803) are described. The filter circuit configuration is not limited to such as long as the falling waveform of the reset signal outputted from the vertical scanning unit 13 can be adjusted. Furthermore, a configuration is acceptable in which a plurality of filter coefficients can be changed (for example, a configuration in which the values of 802 and 803 can be changed on a circuit, such as a reset signal control element 151e shown in FIG. 8E) and the reset signal in which the reset band is adjusted after passing the filter circuit is inputted to the gate of the reset transistor 117.

Furthermore, a configuration is also acceptable in which, using a general tapered circuit, the reset signal inputted to the gate of the reset transistor 117 is adjusted and the reset band of the reset signal is adjusted.

However, it does not follow that the reset signal band inputted to the gate of the reset transistor 117 is only lengthened. When the band of the reset signal inputted to the gate of the reset transistor 117 as shown in t1 of FIG. 6 is lengthen, the reset period of time for each of the pixels 11 is longer. In other words, this represents that the outputted frame rate is slower.

Therefore, it is controlled such that the time constant of the reset signal control element 151 can be outputted at a desired frame rate. More specifically, when the reset signal control element is composed of a plurality of resistances (FIG. 8C), the reset band (t1 or t2) is determined such that a desired frame rate is outputted. In order to adjust a slope of the waveform of the reset signal according to the reset band, the reset signal control element 151 is composed of resistances having different values, has a configuration of a selection circuit in which the resistance value (that is, the reset bandwidth of the reset signal) can be selected, and can change the frame rate according to a desired scene.

Similarly, when the reset signal control element 151 is composed of a filter circuit, a circuit configuration is provided such that the reset bandwidth of the reset signal can be changed or can be selected. Moreover, when the reset signal control element 151 is composed of a tapered reset circuit, a circuit configuration is provided such that the reset bandwidth of the reset signal can be changed or can be selected.

Moreover, the present invention is shown in FIGS. 1 and 7. The effect of suppressing reset noise is significantly large since the present invention uses the inverting amplifier 23 on each of the column signal lines 141 and a feedback band can be widely obtained. Moreover, the present invention is characterized by using a tapered reset circuit for the stack-type solid-state imaging device, and has the reset noise suppression effect that is much larger than the general solid-state imaging device.

Furthermore, as shown in FIG. 7, when the reset signal control element 151 is composed of a tapered circuit, the analog output for each of the pixels 11 is converted into digital signal output in the column signal processing unit 21 on each of the column signal lines 141. A D/A converter circuit (DAC circuit) may also be used (refer to the reset signal control element 151d in FIG. 8D).

More specifically, the waveform which is generated in the DAC circuit and is used for analog-to-digital conversion may be used as a tapered reset signal. When the DAC circuit is not used for analog-to-digital conversion, a tapered reset signal may be generated using the DAD circuit.

In this case, the vertical scanning unit 13 causes the tapered reset signal generated in the column signal processing unit 21 to be outputted. When the signal is selected by the reset signal control element 151 and the selection is appropriate, the tapered reset signal is applied to the gate of the reset transistor 117.

Therefore, in the configuration according to Embodiment 2, by causing a feedback operation using the inverting amplifier 23 on each of the column signal lines 141, the stack-type solid-state imaging device can suppress reset noise and the readout of signal charge on which reset noise is superimposed can be reduced. Therefore, random noise can be suppressed and a frame rate can be outputted at an imaging scene.

Embodiment 3

The following will describe a solid-state imaging device according to Embodiment 2 of the present invention. The differences from Embodiments 1 and 2 will be mainly described.

Description will be made by assuming that the amplifying transistor 113, the selection transistor 115, and the reset transistor 117 are formed in and on a p-type semiconductor substrate in FIGS. 1 and 7, and an n-channel transistor has an n-type diffusion layer. In FIG. 2, 31 is a p-type semiconductor substrate. 41 to 43 and 51 to 55 are n-channel transistors each having an n-type diffusion layer. It should be noted that since the output of the inverting amplifier 23 is positive voltage of 0V or near 0V, it is desirable that the amplifying transistor 113 is a depression-type transistor.

The basic circuit configuration can be configured with FIG. 1 in Embodiment 1 and FIG. 7 in Embodiment 2.

Figure 9:
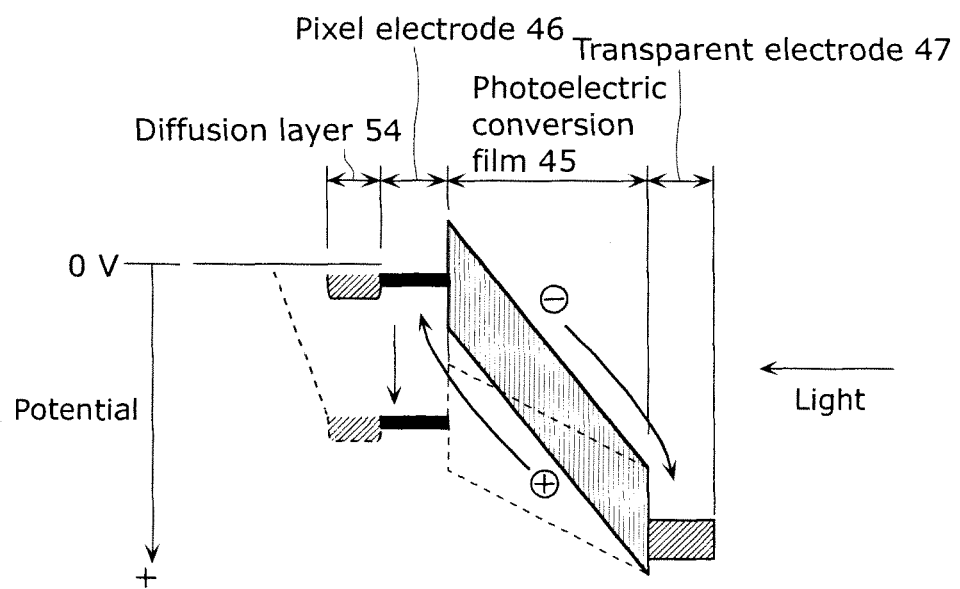
FIG. 9 is a diagram showing potential in a portion along a line I-II of FIG. 2.

FIG. 9 is a diagram showing potential in a portion along line I-II. When there is no signal (reset is performed), the potential of the diffusion layer 54 that is a storage diode is almost 0V. Then, a slightly inverse bias is applied. When the inverse bias is about 25 mV caused by thermal noise, part of the charge in the storage diode may reach the side of the substrate. Therefore, it is favorable that the inverse bias to be applied in a period of time for storing signal charge is greater than or equal to about 0.1 V. By setting the potential of the storage diode at near 0V, reverse leakage current (dark current) flowing between the storage diode and the semiconductor substrate 31 can be small. Meanwhile, positive voltage is applied to the transparent electrode 47. Light entering from the upper portion of the transparent electrode 47 passes through the transparent electrode 47 and enters the photoelectric conversion film 45, and then is converted into an electron-hole pair. Of the converted electron-hole pair, the electron is transferred to the side of the transparent electrode 47 and then flows to a power source (not illustrated) connected to the transparent electrode 47. The hole is transferred to the side of the diffusion layer 54 and then is stored here. Therefore, the potential of the diffusion layer is converted into a plus direction, and voltage is applied to between the diffusion layer 54 and the semiconductor substrate 31. With this, reverse leakage current (dark current) flows between the diffusion layer 54 and the semiconductor substrate 31, and this is flow noise. However, when a signal exists, the noise is not easy to notice. Therefore, there is no problem.

By holes stored in the diffusion layer 54, the voltage converted into the positive side is transmitted to the gate electrode 41 of the amplifying transistor 113. The signal amplified by the amplifying transistor 113 is outputted to the column signal line 141 via the selection transistor 115.

The general solid-state imaging element requires the application of a reset signal having high amplitude to the gate of the reset transistor for storing electrons having minus charge in the diffusion layer. According to the configuration of the present invention, since holes having positive charge are stored in the diffusion layer, it is necessary for reset signal having small amplitude to be applied to the gate of the reset transistor.

Figure 10:
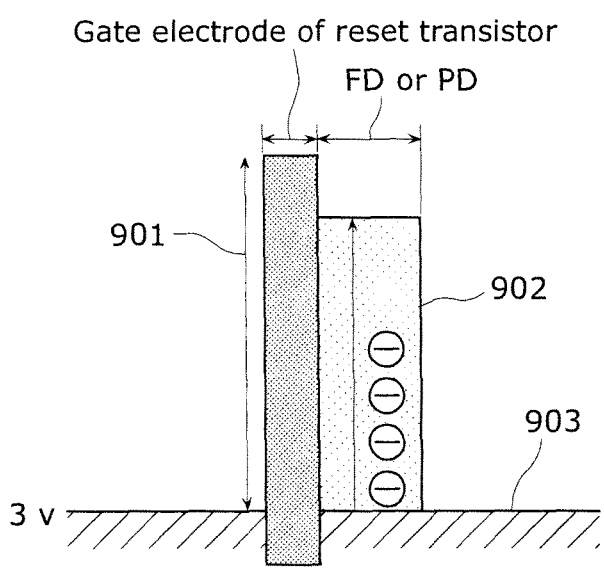
FIG. 10 is a potential diagram a pixel according to a conventional technique.
Figure 11:
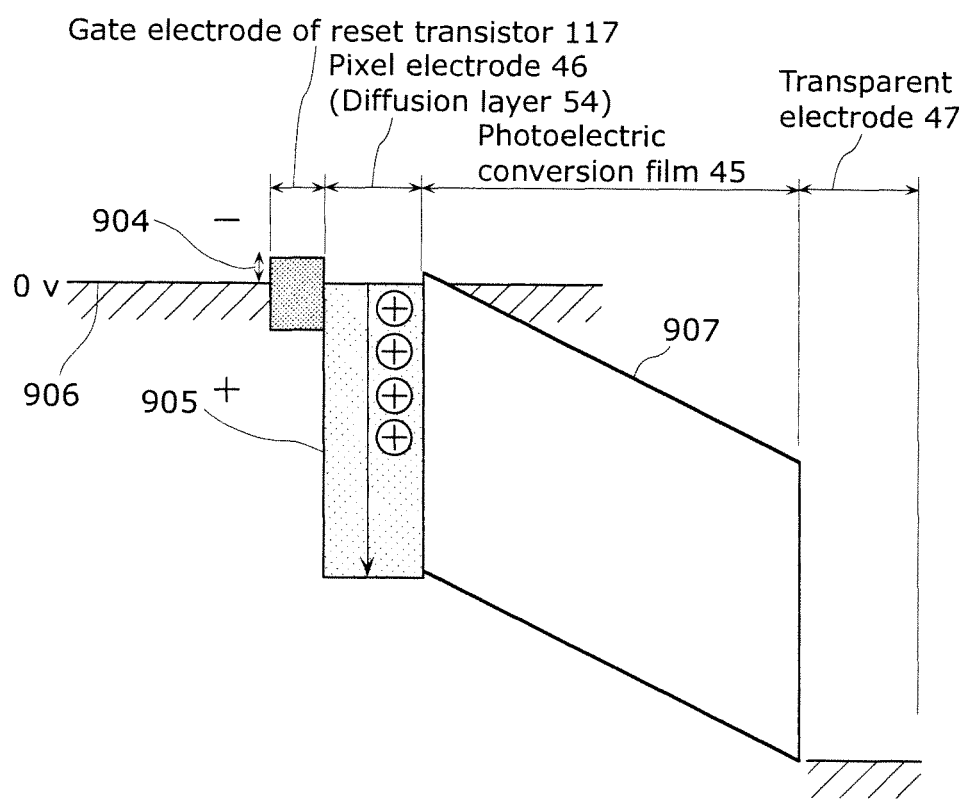
FIG. 11 is a potential diagram of a pixel according to Embodiment 3.

FIG. 10 shows a potential diagram of the general buried photodiode-type solid-state imaging device. FIG. 11 shows a potential diagram of the stack-type solid-state imaging device according to Embodiment 3.

Since the general buried photodiode-type solid-state imaging device stores charge 902 (here, electron) on a negative (minus) side with respect to a standard level 903 (for example, 3V), the reset signal having a large amplitude such as 901 needs to be applied.

In contrast, since the stack-type solid-state imaging device according to Embodiment 3 applies positive voltage to (a potential 907 of) the photoelectric conversion film 45 and charge 905 (here, holes) is stored on a positive side with respect to a standard level 906 (for example, 0V), a reset signal having a small amplitude such as 904 may be applied.

Figure 12:
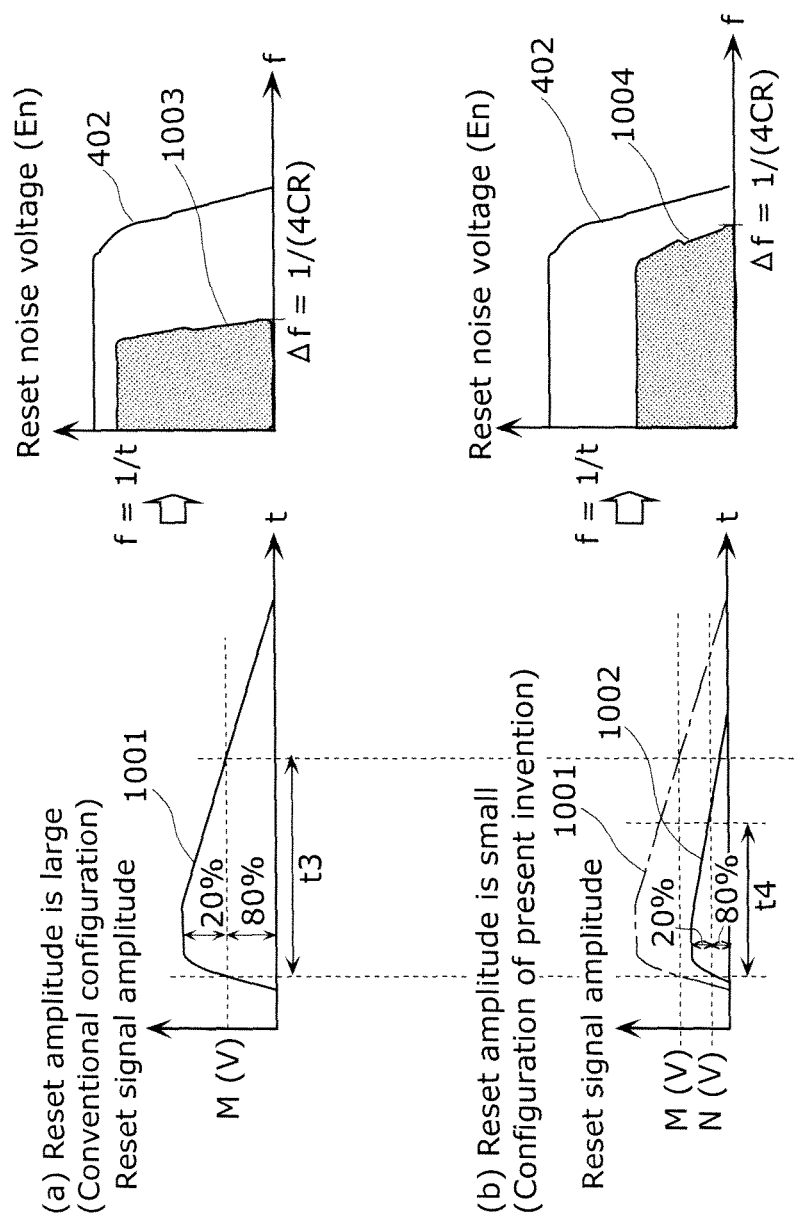
FIG. 12 illustrates a relationship between reset signal amplitude and reset noise in Embodiment 3.

FIG. 12 shows a relationship between the time and the amplitude of a reset signal to be applied to the reset transistor 117. The part (a) of FIG. 12 shows the case where a reset signal with a general configuration shows an amplitude 1001. A period of time t3 of 80 percent (M volts) of the amplitude 1001 of the reset signal is determined as a reset band and the amplitude of the reset signal corresponds to power source voltage level.

The part (b) of FIG. 12 is the case of amplitude 1002 of a reset signal according to a configuration of the present invention. A period of time t4 of 80 percent (N volts) of the amplitude 1002 of the reset signal is determined as a reset band. The amplitude 1002 of the reset signal may be any one of being: lower than the maximum voltage to be applied to the drain of the amplifying transistor 113; lower than the maximum voltage to be applied to the gate of the selection transistor 115; lower than the power source voltage to be applied to the inverting amplifier 23; and lower than the maximum voltage to be applied to the transparent electrode 47 (a relationship of M>N).

Therefore, as obvious from the comparison between t3 and t4 in FIG. 12, the configuration according to Embodiment 3 allows the amplitude 1002 of a reset signal to be applied to the gate of the reset transistor 117 to be small and allows the reset band (reset time) to be further shortened, with the result that the frame rate can be higher.

This can be realized in a configuration according to Embodiments 1 and 2. It is possible to suppress reset noise, to reduce readout of signal charge on which reset noise is superimposed, and to suppress random noise. Furthermore, the control of a frame rate according to a scene is also effective.

Embodiment 4

The following will describe a solid-state imaging device according to Embodiment 4 of the present invention. The differences from Embodiments 1 to 3 will be mainly described.

In Embodiment 2, the suppression of random noise by the suppression of the reset signal by a feedback circuit and the suppression of reset noise by controlling the reset band of the reset signal in the stack-type solid-state imaging device has been described. The suppression of reset noise with the combination is not limited to the stack-type solid-state imaging device such as that in the present invention, and is a technique that can be realized in a general solid-state imaging device.

More specifically, it is possible to be implemented by causing operation according to Embodiments 2 and 3 through setting the pixel 11 in FIG. 7 as a general pixel configuration (buried photodiode-type or rear surface irradiation type). The reset noise can be effectively suppressed, and the readout of signal charge on which reset noise is superimposed can be reduced, and the random noise can be suppressed. Furthermore, since it is effective for the control of a frame rate corresponding to scene, a significant effect can be obtained also in the general solid-state imaging device.

Embodiment 5

The following will describe a solid-state imaging device according to Embodiment 5 of the present invention. The differences from Embodiments 1 to 4 will be mainly described.

Figure 13:
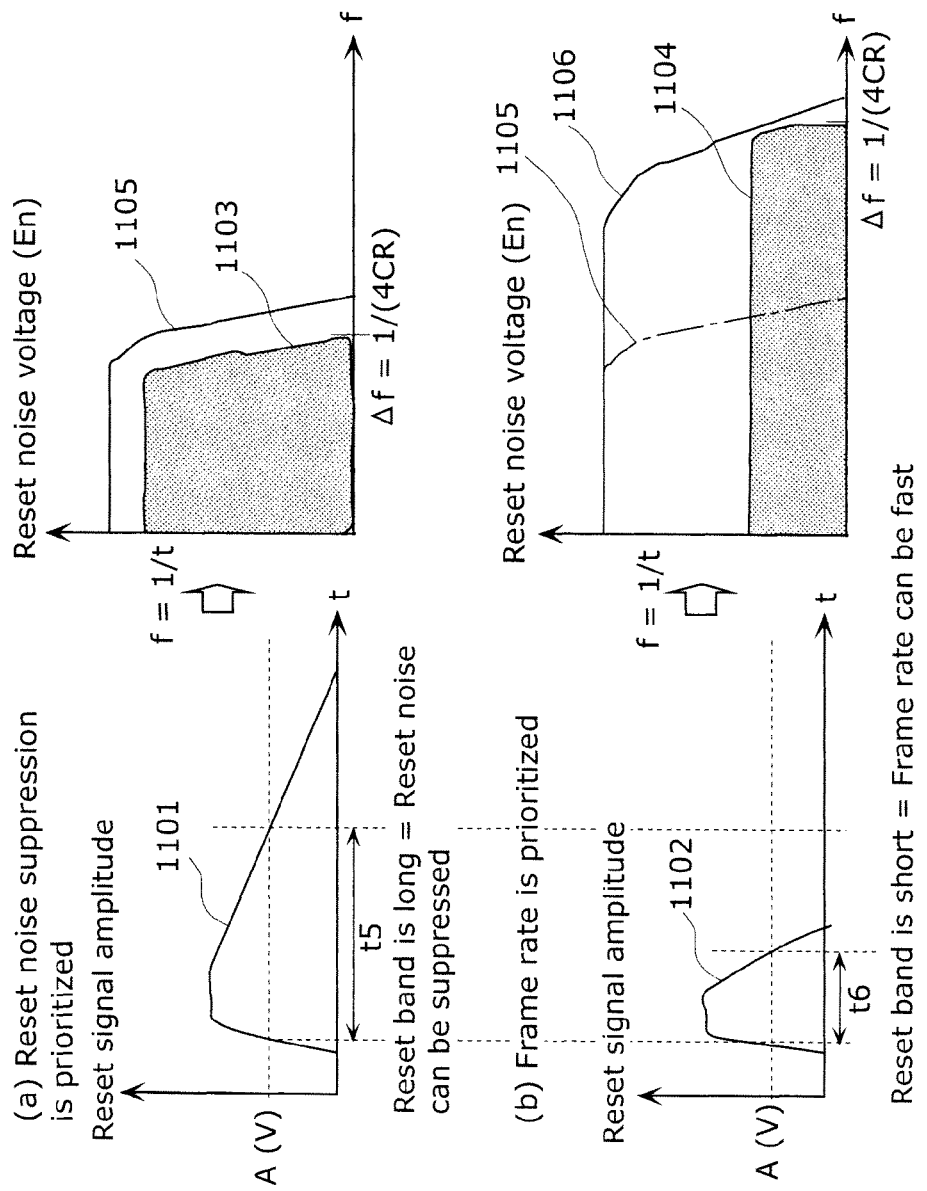
FIG. 13 illustrates reset noise caused by reset band in Embodiment 5.

FIG. 13 shows (a) when the reset noise suppression is prioritized according to an image scene and (b) when the frame rate is prioritized according to an imaging scene. When the frame rate is not especially necessary (for example, when there is little signal component because of darkness, exposure time is extended for obtaining as many signal components as possible), the reset noise is easy to notice and therefore the reset noise suppression should be prioritized. In contrast, when high-speed imaging is performed, there is a case where the frame rate must be prioritized.

Using the reset signal control element in FIG. 7, the reset band is adjusted as follows.

When (a) the reset noise suppression is prioritized, the reset signal to be applied to the reset transistor 117 is made dull such as 1101, the reset band is set to be sufficiently long as shown in t5. At this time, the feedback band of the inverting amplifier 23 in FIG. 7 is set to be 1105, and the reset noise that can be suppressed is like 1103.

When (b) the frame rate is prioritized, the reset signal to be applied to the reset transistor 117 is set to be steep like 1102, the reset band is set to be short like t6. Since the reset noise is extended to a high-frequency region such as 1104, the feedback band of the inverting amplifier 23 in FIG. 7 cannot be completely suppressed in 1105. By extending the feedback band of the inverting amplifier 23 to a band such as 1106, it is possible for the reset noise 1104 to be suppressed.

As a method for extending the feedback band of the inverting amplifier 23 in FIG. 7 from the state of 1102 to the state of 1106, there are a method for extending the feedback band by increasing current to flow in an amplifying unit of the inverting amplifier 23 (performing high-speed feedback) and a method for extending the feedback band by increasing the number of transistors for use in the inverting amplifier 23 and increasing the driving capacity of the circuit. In contrast, when the frame rate is not prioritized such as (a), the inverting amplifier 23 is controlled for adjusting the feedback band from the state of 1106 to the state of 1105.

When the feedback band is wide such as (b), the band of reset noise that can be suppressed is extended. In that case, however, since it is necessary for the current that drives the inverting amplifier 23 to be increased, a negative effect of an increase in power consumption is generated. Therefore, it is desirable that the feedback band of the inverting amplifier 23 works with the reset band of the reset signal and controls the current necessary for driving and the driving capacity of the circuit in consideration of the frame rate.

It should be noted that this can be implemented the configurations according to Embodiments 1 to 4.

Therefore, by introducing the configuration according to Embodiment 5, the reset noise can be suppressed and the readout of signal charge on which reset noise is superimposed can be reduced, with the result that the random noise can be suppressed. Furthermore, by controlling the reset band of the reset signal to be inputted to the gate of the reset transistor 117 and the feedback band of the inverting amplifier 23 for use in the feedback, the frame rate corresponding to the scene can be outputted in consideration of power consumption.

CONCLUSION

As described above with reference to the drawings, the solid-state imaging device according to the embodiments of the present invention is a configuration in which the random noise can be suppressed by using a scheme of controlling the feedback circuit and the band of the reset signal and considering the frame rate.

More specifically, the solid-state imaging device includes a semiconductor substrate, a plurality of pixels each of which is disposed on the semiconductor substrate in rows and columns, a column signal line which is formed for each of the columns, and an inverting amplifier connected to the column signal line, wherein the pixel includes a reset transistor, a selection transistor, and an amplifying transistor that are formed in and on the semiconductor substrate, and a photoelectric conversion unit, the photoelectric conversion unit includes a photoelectric conversion film formed on the semiconductor substrate, a pixel electrode formed on the surface of the photoelectric conversion film on the side of the semiconductor substrate, and a transparent electrode formed on the surface of the photoelectric conversion film on the opposite side of the pixel electrode, wherein the gate of the amplifying transistor is connected to the pixel electrode, the drain of the reset transistor is connected to the pixel electrode, the amplifying transistor and the selection transistor are connected in series, and the output of the pixel is connected to the column signal line. By feeding back the output of the inverting transistor to the source of the reset transistor when the selection transistor and the reset transistor are in a conduction state, random noise can be suppressed since the reset noise generated in the reset transistor can be suppressed and the readout of signal charge on which reset noise is superimposed can be reduced.

More specifically, the solid-state imaging device includes a semiconductor substrate, a plurality of pixels each of which is disposed on the semiconductor substrate in rows and columns, a column signal line which is formed for each of the columns, and an inverting amplifier connected to the column signal line, wherein the pixel includes a reset transistor, a selection transistor, and an amplifying transistor that are formed on the semiconductor substrate, and a photoelectric conversion unit, the photoelectric conversion unit includes a photoelectric conversion film formed on the semiconductor substrate, a pixel electrode formed on the surface of the photoelectric conversion film on the side of the semiconductor substrate, and a transparent electrode formed on the surface of the photoelectric conversion film on the opposite side of the pixel electrode, wherein the gate of the amplifying transistor is connected to the pixel electrode, the drain of the reset transistor is connected to the pixel electrode, the amplifying transistor and the selection transistor are connected in series, and the output of the pixel is connected to the column signal line. When the selection transistor and the reset transistor are in a conduction state, the output of the inverting amplifier is fed back to the source of the reset transistor, and the reset signal to be applied to the gate for putting the reset transistor under a conduction state has a configuration in which the reset band can be adjusted by adjusting the waveform.

With this, the feedback operation from the inverting amplifier can suppress the reset noise generated in the reset transistor, can reduce the readout of signal charge on which reset noise is superimposed, and can suppress random noise.

Furthermore, by controlling the band of the reset signal, the reset signal can be reduced. By controlling the band of the reset signal, the reset operation can be performed in consideration of the frame rate.

Moreover, the solid-state imaging device has a configuration in which resistance is inserted into the line of a reset signal to be applied to the gate for putting the reset transistor under a conduction state. By inserting a plurality of resistances and the selection circuit into the line of the reset signal to be applied to the gate for putting the reset transistor under a conduction state, and by adjusting the waveform of the reset signal by the resistance value, and by selecting the reset band of the reset signal by the selection circuit, the reset noise can be suppressed and the readout of signal charge on which reset noise is superimposed can be reduced and therefore the random noise can be suppressed. Furthermore, by controlling the band of the reset signal, the reset operation can be performed in consideration of the frame rate.

Moreover, the solid-state imaging device has a configuration in which a filter circuit is inserted into the line of the reset signal to be applied to the gate for putting the reset transistor under a conduction state. By inserting a filter circuit into the line of the reset signal to be applied to the gate for putting the reset transistor under a conduction state, by adjusting the waveform of the reset signal with the filter circuit, and by selecting the reset band of the reset signal, the reset noise can be suppressed and the readout of signal charge on which reset noise is superimposed can be reduced, and therefore the random noise can be suppressed. Furthermore, by controlling the band of the reset signal, the reset operation can be performed in consideration of the frame rate.

Moreover, the solid-state imaging device has a configuration in which a tapered circuit is inserted into the line of a reset signal to be applied to the gate for putting the reset transistor under a conduction state. By inserting a tapered circuit into the line of the reset signal to be applied to the gate for putting the reset transistor under a conduction state, by adjusting the waveform of the reset signal by the tapered circuit, and by selecting the reset band of the reset signal, the reset noise can be suppressed and the readout of signal charge on which reset noise is superimposed can be reduced, and therefore the random noise can be suppressed. Furthermore, by controlling the band of the reset signal, the reset operation can be performed in consideration of the frame rate.

Moreover, by providing the column signal line with a circuit which converts the analog output of the pixel into a digital signal and by using the circuit in the analog-to-digital conversion circuit for the tapered circuit, the doubling of the circuit becomes possible and an increase in the size of the circuit can be prevented.

More specifically, the solid-state imaging device includes a semiconductor substrate, a plurality of pixels each of which is disposed on the semiconductor substrate in rows and columns, a column signal line which is formed for each of the columns, and an inverting amplifier connected to the column signal line, wherein the pixel includes a reset transistor, a selection transistor, an amplifying transistor that are formed in and on the semiconductor substrate, and a photoelectric conversion unit, the photoelectric conversion unit includes a photoelectric conversion film formed on the semiconductor substrate, a pixel electrode formed on the surface of the photoelectric conversion film on the side of the semiconductor substrate, and a transparent electrode formed on the surface of the photoelectric conversion film on the opposite side of the pixel electrode, wherein the gate of the amplifying transistor is connected to the pixel electrode, the drain of the reset transistor is connected to the pixel electrode, the amplifying transistor and the selection transistor are connected in series, and the output of the pixel is connected to the column signal line. When the selection transistor and the reset transistor are in a conduction state, the output of the inverting amplifier is fed back to the source of the reset transistor, and the amplitude of the reset signal to be applied to the gate for putting the reset transistor under a conduction state is set to be lower than the voltage to be applied to the drain of the amplifying transistor.

Moreover, the solid-state imaging device includes a semiconductor substrate, a plurality of pixels each of which is disposed on the semiconductor substrate in rows and columns, a column signal line formed for each of the columns, and an inverting amplifier connected to the column signal line, wherein the pixel includes a reset transistor, a selection transistor, and an amplifying transistor that are formed on the semiconductor substrate, and a photoelectric conversion unit, the photoelectric conversion unit includes a photoelectric conversion film formed on the semiconductor substrate of the photoelectric conversion film, a pixel electrode formed on the surface of the photoelectric conversion film on the side of the semiconductor substrate, and a transparent electrode formed on the surface of the photoelectric conversion film on the opposite side of the pixel electrode, wherein the gate of the amplifying transistor is connected to the pixel electrode, the drain of the reset transistor is connected to the pixel electrode, the amplifying transistor and the selection transistor are connected in series, and the output of the pixel is connected to the column signal line. When the selection transistor and the reset transistor are in a conduction state, the output of the inverting amplifier is fed back to the source of the reset transistor, and the amplitude of the reset signal to be applied to the gate for putting the reset transistor under a conduction state is set to be lower than the voltage to be applied to the gate of the selection transistor.

Moreover, the solid-state imaging device includes a semiconductor substrate, a plurality of pixels each of which is disposed on the semiconductor substrate in rows and columns, a column signal line formed for each of the columns, and an inverting amplifier connected to the column signal line, wherein the pixel includes a reset transistor, a selection transistor, and an amplifying transistor that are formed on the semiconductor substrate, and a photoelectric conversion unit, the photoelectric conversion unit includes a photoelectric conversion film formed on the semiconductor substrate, a pixel electrode formed on the surface of the photoelectric conversion film on the side of the semiconductor substrate, and a transparent electrode formed on the surface of the photoelectric conversion film on the opposite side of the pixel electrode, wherein the gate of the amplifying transistor is connected to the pixel electrode, the drain of the reset transistor is connected to the pixel electrode, the amplifying transistor and the selection transistor are connected in series, and the output of the pixel is connected to the column signal line. When the selection transistor and the reset transistor are in a conduction state, the output of the inverting amplifier is fed back to the source of the reset transistor, and the amplitude of the reset signal to be applied to the gate for putting the reset transistor under a conduction state is set to be lower than the power source voltage to be applied to the inverting amplifier.

Moreover, the solid-state imaging device includes a semiconductor substrate, a plurality of pixels each of which is disposed on the semiconductor substrate in rows and columns, a column signal line formed for each of the columns, and an inverting amplifier connected to the column signal line, wherein the pixel includes a reset transistor, a selection transistor, and an amplifying transistor that are formed on the semiconductor substrate, and a photoelectric conversion unit, the photoelectric conversion unit includes a photoelectric conversion film formed on the semiconductor substrate, a pixel electrode formed on the surface of the photoelectric conversion film on the side of the semiconductor substrate, and a transparent electrode formed on the surface of the photoelectric conversion film on the opposite side of the pixel electrode, wherein the gate of the amplifying transistor is connected to the pixel electrode, the drain of the reset transistor is connected to the pixel electrode, the amplifying transistor and the selection transistor are connected in series, and the output of the pixel is connected to the column signal line. When the selection transistor and the reset transistor are in a conduction state, the output of the inverting amplifier is fed back to the source of the reset transistor, and the amplitude of the reset signal to be applied to the gate for putting the reset transistor under a conduction state is set to be lower than the power source voltage to be applied to the transparent electrode.

With this, by the feedback operation from the inverting amplifier, the reset noise generated in the reset transistor can be suppressed, the readout of signal charge on which reset noise is superimposed can be reduced, and random noise can be suppressed.

Furthermore, since the amplitude of the reset signal is one of being: lower than the maximum voltage to be applied to the drain of the amplifying transistor; lower than the maximum voltage to be applied to the gate of the selection transistor; lower than the power source voltage to be applied to the inverting amplifier; and lower than the maximum voltage to be applied to the transparent electrode, it is easier to control an operation for shortening the time for the reset operation, and the reset operation in consideration of the frame rate can be performed.

Moreover, the solid-state imaging device includes a semiconductor substrate, a plurality of pixels each of which is disposed on the semiconductor substrate in rows and columns, a column signal line formed for each of the columns, and an inverting amplifier connected to the column signal line, wherein the pixel includes a reset transistor, a selection transistor, and an amplifying transistor that are formed on the semiconductor substrate, and a photoelectric conversion unit, wherein the gate of the amplifying transistor is connected to the pixel electrode, the drain of the reset transistor is connected to the pixel electrode, the amplifying transistor and the selection transistor are connected in series, and the output of the pixel is connected to the column signal line. When the selection transistor and the reset transistor are in a conduction state, the output of the inverting amplifier is fed back to the source of the reset transistor, and a tapered circuit is inserted into the line of the reset signal to be applied to the gate for putting the reset transistor under a conduction state such that the reset band can be adjusted by adjusting the reset waveform.

It should be noted that by introducing a configuration in which the frequency feature of the inverting amplifier connected to the column signal line can be selected and changed, not only the band of the reset signal but also the band related to the feedback can be controlled. Therefore, the reset operation can be performed in consideration of power consumption and the frame rate.

It should be noted that the above described embodiments describe the case where the reset transistor 117 is an n-type MOS transistor and the trailing edge of the reset pulse included in the reset signal to be inputted to the gate is a falling edge. When the reset transistor 117 is a p-type MOS transistor, the reset pulse inputted to the gate is a negative pulse (downward pulse) and the trailing edge of the reset pulse is a riding edge. In this case, the reset signal control element (waveform adjusting unit) 151 adjusts a waveform to provide a slope to the trailing edge, that is, the rising edge of the reset pulse included in the row reset signal, and provides the row reset signal including the adjusted reset pulse to the gate of the reset transistor 117. In other words, the reset signal control element (waveform adjusting unit) 151 adjusts the frequency band of the rising edge that is the trailing edge of the row reset signal.

As described above, the solid-state imaging device according to an aspect of the present invention includes the semiconductor substrate 31, a plurality of pixels 11 disposed in rows and columns in and on the semiconductor substrate, the column signal line 141 formed for each of the columns, the inverting amplifier 23 connected to the column signal line, and the feedback line 126, provided for each of the columns, for the feedback of the output signal of the inverting amplifier 23 to the pixels 11 in a corresponding column. Each of the pixels 11 includes the reset transistor 117, the selection transistor 115, the amplifying transistor 113, and the photoelectric conversion unit 111. The photoelectric conversion unit 111 includes the photoelectric conversion film 45 which performs photoelectric conversion, the pixel electrode 46 formed on the surface of the photoelectric conversion film on the side of the semiconductor substrate, and the transparent electrode 47 formed on the surface of the photoelectric conversion film 45 on the opposite side of the pixel electrode 46. The amplifying transistor 113 has a gate connected to the pixel electrode 46, and outputs the signal voltage corresponding to the potential of the pixel electrode 46 to the column signal line 141 via the selection transistor 115. One of the source and the drain of the reset transistor 117 is connected to the pixel electrode 46, and the other of the source and the drain is connected to a corresponding feedback line 126.

Moreover, it is desirable that with the row selection signal being applied to the gate of the selection transistor 115 and the row reset signal being applied to the gate of the reset transistor 117, the row reset signal is validated after a certain period of time following validation of the row selection signal, and is valid for a period within a period in which the row selection signal is validated.

Moreover, the solid-state imaging device includes the reset signal control element (waveform adjusting unit) 151 for adjusting the waveform of the row reset signal to be applied to the gate of the reset transistor, wherein it is desirable that the reset signal control element (waveform adjusting unit) 151 adjusts the waveform to provide slope to the trailing edge of the reset pulse included in the row reset signal and the row reset signal including the adjusted reset pulse is provided to the gate of the reset transistor.

Moreover, the solid-state imaging device can switch between imaging at the first frame rate and imaging at the second frame rate that is higher than the first frame rate. The reset signal control element (waveform adjusting unit) 151 may adjust the slope of the trailing edge of the reset pulse such that transition time necessary for the rising or the falling of the trailing edge of the reset pulse in the imaging at the first frame rate is longer than the transition time in the imaging at the second frame rate.

Here, the reset signal control element (waveform adjusting unit) 151 may be a filter transistor inserted into the reset control line 123 connected to the gate of the reset transistor.

Here, the reset signal control element (waveform adjusting unit) 151 may adjust the slope of the trailing edge of the reset pulse by changing the circuit constant of the filter circuit.

Here, the reset signal control element (waveform adjusting unit) 151 includes a digital-to-analog converter which outputs, as the row reset signal, the analog signal having a slope in the trailing edge of the reset pulse.

Here, the solid-state imaging device further includes the reset signal control element (waveform adjusting unit) 151 for adjusting the waveform of the row reset signal to be applied to the gate of the reset transistor. The reset signal control element (waveform adjusting unit) 151 may adjust the frequency band of the trailing edge of the reset pulse in the row reset signal.

Here, the row reset signal before the waveform adjustment having an amplitude corresponding to the power source voltage is inputted to the reset signal control element (waveform adjusting unit) 151, and the reset signal controlling element (waveform adjusting unit) 151 may adjust the waveform of the row reset signal such that its amplitude is small.

Here, the amplitude of the row reset signal to be applied to the gate of the reset transistor may be smaller than the maximum voltage to be applied to the drain of the amplifying transistor.

Here, the amplitude of the row reset signal to be applied to the gate of the reset transistor may be smaller than the maximum voltage to be applied to the gate of the selection transistor.

Here, the amplitude of the row reset signal to be applied to the gate of the reset transistor may be smaller than the power source voltage to be applied to the inverting amplifier.

Here, the amplitude of the row reset signal to be applied to the gate of the reset transistor may be smaller than the maximum voltage to be applied to the transparent electrode.

Here, the amplitude of the row reset signal to be applied to the gate of the reset transistor may be smaller than (a) the maximum voltage to be applied to the drain of the amplifying transistor, (b) the maximum voltage to be applied to the gate of the selection transistor, (c) the power source voltage to be applied to the inverting amplifier, and (d) the maximum voltage to be applied to the transparent electrode.

Moreover, another aspect of the solid-state imaging device includes a plurality of pixels 11 disposed in rows and columns on the semiconductor substrate, a vertical scanning unit (row scanning unit) 13 configured to generate a row reset signal, and the reset signal control element (waveform adjusting unit) 151 for adjusting the waveform of the row reset signal to be applied to the gate of the reset transistor. The pixel 11 includes the reset transistor 117, the selection transistor 115, the amplifying transistor 113, and the photoelectric conversion unit 111. The photoelectric conversion unit 111 includes the photoelectric conversion film 45 which performs photoelectric conversion, the pixel electrode 46 formed on the surface of the photoelectric conversion film on the side of the semiconductor substrate, and the transparent electrode 47 formed on the surface of the photoelectric conversion film on the opposite side of the pixel electrode. The amplifying transistor 113 includes the gate connected to the pixel electrode 46, outputs the signal voltage corresponding to the potential of the pixel electrode 46 to the column signal line 141 via the selection transistor 115. The reset signal control element (waveform adjusting unit) 151 adjusts the waveform to provide a slope to the trailing edge of the reset pulse included in the row reset signal, and provides the row reset signal including the adjusted reset pulse to the gate of the reset transistor.

Moreover, the following is an aspect of a method for driving the solid-state imaging device.

As described above, the solid-state imaging device includes the semiconductor substrate 31, a plurality of pixels 11 disposed in rows and columns on the semiconductor substrate 31, the column signal line 141 formed for each of the columns, the inverting amplifier 23 connected to the column signal line, and the feedback line 126, provided for each of the columns, for the feedback of the output signal of the inverting amplifier 23 to the pixels in of a corresponding column.

The pixel 11 includes the reset transistor 117, the selection transistor 115, the amplifying transistor 113, and the photoelectric conversion unit 111.

The photoelectric conversion unit 111 includes the photoelectric conversion film 45 which performs photoelectric conversion, the pixel electrode 46 formed on the surface of the photoelectric conversion film on the side of the semiconductor substrate, and the transparent electrode 47 formed on the surface of the photoelectric conversion film on the opposite side of the pixel electrode.

The amplifying transistor 113 has a gate connected to the pixel electrode 46, and outputs the signal voltage corresponding to the potential of the pixel electrode 46 to the column signal line 141 via the selection transistor 115. One of the source and the drain of the reset transistor 117 is connected to the pixel electrode 46, and the other is connected to a corresponding feedback line 126.

In the above described method for driving the solid-state imaging device, by validating the row selection signal in the gate of the selection transistor 115, the output signal of the amplifying transistor is outputted to the column signal line, and by validating the row reset signal after a certain period of time following validation of the row selection signal, the output of the inverting amplifier is fed back to the pixel electrode via the reset transistor.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The solid-state imaging element can be implemented as a stack-type solid-state imaging device which can suppress the reset noise and output the frame rate corresponding to the scene. The solid-state imaging element is particularly effective for a small and thin type image pickup device for capturing a moving image.

The invention claimed is:

1. A solid-state imaging device comprising:
   a semiconductor substrate;
   a plurality of pixels disposed on the semiconductor substrate in rows and columns;
   a column signal line formed for each of the columns;
   an inverting amplifier connected to each of the column signal lines; and
   a feedback line provided, for each of the columns, to feed back an output signal of the inverting amplifier to the pixels in the column,
   wherein each of the pixels includes a reset transistor, a selection transistor, an amplifying transistor, and a photoelectric conversion unit,
   the photoelectric conversion unit includes:
   a photoelectric conversion film which performs photoelectric conversion;
   a pixel electrode formed on a surface of the photoelectric conversion film on a side of the semiconductor substrate; and
   a transparent electrode formed on a surface of the photoelectric conversion film on an opposite side of the pixel electrode,
   wherein the amplifying transistor has a gate connected to the pixel electrode and outputs signal voltage corresponding to potential of the pixel electrode to the column signal line via the selection transistor, and
   the reset transistor has one of a source and a drain connected to the pixel electrode and the other of the source and the drain connected to a corresponding feedback line,
   wherein a row selection signal is applied to a gate of the selection transistor,
   a row reset signal is applied to a gate of the reset transistor, and
   the row reset signal is validated after a certain period of time following validation of the row selection signal, and is valid for a period within a period of time in which the row selection signal is valid.

2. The solid-state imaging device according to claim 1, further comprising
   a waveform adjusting unit configured to adjust a waveform of the row reset signal to be applied to the gate of the reset transistor,
   wherein the waveform adjusting unit is configured to adjust the waveform of a reset pulse of the reset signal to have a slope at a trailing edge, and to provide the gate of the reset transistor with the reset signal including the adjusted reset pulse.

3. The solid-state imaging device according to claim 2, wherein the solid-state imaging device is capable of switching between imaging at a first frame rate and imaging at a second frame rate that is higher than the first frame rate, and
   the waveform adjusting unit is configured to adjust the reset pulse to have a slope of the trailing edge so that transition time for the imaging at the first frame rate is longer than transition time for the imaging at the second frame rate, the transition time being required for the trailing edge of the reset pulse to fall or rise.

4. The solid-state imaging device according to claim 2, wherein the waveform adjusting unit is a filter circuit which is inserted into a reset control line connected to the gate of the reset transistor.

5. The solid-state imaging device according to claim 4, wherein the waveform adjusting unit is configured to adjust the slope of the trailing edge of the reset pulse by changing a circuit constant of the filter circuit.

6. The solid-state imaging device according to claim 2, wherein the waveform adjusting unit includes a digital-to-analog converter which outputs, as the row reset signal, an analog signal having a slope at the trailing edge of the reset pulse.

7. The solid-state imaging device according to claim 2, wherein the waveform adjusting unit is further configured to receive a row reset signal before waveform adjustment having an amplitude corresponding to a power source voltage, and to adjust the waveform to reduce the amplitude of the row reset signal.

8. The solid-state imaging device according to claim 2, wherein the amplitude of the row reset signal to be applied to the gate of the reset transistor is smaller than a maximum voltage to be applied to the drain of the amplifying transistor.

9. The solid-state imaging device according to claim 2, wherein the amplitude of the row reset signal to be applied to the gate of the reset transistor is smaller than a maximum voltage to be applied to the gate of the selection transistor.

10. The solid-state imaging device according to claim 2, wherein the amplitude of the row reset signal to be applied to the gate of the reset transistor is smaller than a power source voltage to be applied to the inverting amplifier.

11. The solid-state imaging device according to claim 2, wherein the amplitude of the row reset signal to be applied to the gate of the reset transistor is smaller than a maximum voltage to be applied to the transparent electrode.

12. The solid-state imaging device according to claim 2, wherein the amplitude of the row reset signal to be applied to the gate of the reset transistor is smaller than:
    (a) a maximum voltage to be applied to the drain of the amplifying transistor;
    (b) a maximum voltage to be applied to the gate of the selection transistor;
    (c) a power source voltage to be applied to the inverting amplifier; and
    (d) a maximum voltage to be applied to the transparent electrode.

13. The solid-state imaging device according to claim 1, further comprising
    a waveform adjusting unit configured to adjust a waveform of the row reset signal to be applied to the gate of the reset transistor,
    wherein the waveform adjusting unit is configured to adjust a frequency band of a trailing edge of the reset pulse included in the row reset signal.

14. A method for driving a solid-state imaging device, wherein the solid-state imaging device includes:
    a semiconductor substrate;
    a plurality of pixels disposed on the semiconductor substrate in rows and columns;

a column signal line formed for each of the columns;
an inverting amplifier connected to each of the column signal lines; and
a feedback line provided, for each of the columns, to feed back an output signal of the inverting amplifier to the pixels in the column,
wherein each of the pixels includes a reset transistor, a selection transistor, an amplifying transistor, and a photoelectric conversion unit,
the photoelectric conversion unit includes:
a photoelectric conversion film which performs photoelectric conversion;
a pixel electrode formed on a surface of the photoelectric conversion film on a side of the semiconductor substrate; and
a transparent electrode formed on a surface of the photoelectric conversion film on an opposite side of the pixel electrode,
wherein the amplifying transistor has a gate connected to the pixel electrode and outputs signal voltage corresponding to potential of the pixel electrode to the column signal line via the selection transistor, and
the reset transistor has one of a source and a drain connected to the pixel electrode and the other of the source and the drain connected to a corresponding feedback line,
the method for driving the solid-state imaging device comprising:
outputting an output signal of the amplifying transistor to a column signal line by validating a row selection signal in a gate of the selection transistor; and
feeding back an output of the inverting amplifier via the reset transistor to the pixel electrode by validating the row reset signal after a certain period of time following validation of the row selection signal.

* * * * *